United States Patent [19]

Rostoker et al.

[11] Patent Number: 5,729,894
[45] Date of Patent: Mar. 24, 1998

[54] METHOD OF ASSEMBLING BALL BUMP GRID ARRAY SEMICONDUCTOR PACKAGES

[75] Inventors: Michael D. Rostoker; Mark R. Schneider, both of San Jose; Edwin Fulcher, Palo Alto, all of Calif.

[73] Assignee: LSI Logic Corporation, Milpitas, Calif.

[21] Appl. No.: 664,146

[22] Filed: Jun. 14, 1996

Related U.S. Application Data

[60] Continuation of Ser. No. 382,147, Feb. 1, 1995, abandoned, which is a division of Ser. No. 938,690, Sep. 1, 1992, abandoned, which is a continuation-in-part of Ser. No. 917,894, Jul. 21, 1992, abandoned.

[51] Int. Cl.[6] .................... H05K 3/30; H05K 3/10; H01K 3/10
[52] U.S. Cl. .................. 29/832; 29/840; 29/841; 29/846; 29/852; 257/693
[58] Field of Search .................. 29/832, 841, 850, 29/852, 840, 846; 257/723–4, 737–8, 786, 738, 693, 697; 361/760–1, 763–4, 779, 782–3, 792–95

[56] References Cited

U.S. PATENT DOCUMENTS

| | | | |
|---|---|---|---|
| 4,539,622 | 9/1985 | Akasaki | 361/401 |
| 4,628,406 | 12/1986 | Smith et al. | 29/832 |
| 4,975,765 | 12/1990 | Ackermann et al. | 257/700 |
| 5,216,278 | 6/1993 | Lin et al. | 257/688 |
| 5,334,857 | 8/1994 | Mennitt et al. | 257/778 |

FOREIGN PATENT DOCUMENTS

| | | | |
|---|---|---|---|
| 62-89346 | 4/1987 | Japan | 257/693 |
| 2-253647 | 10/1990 | Japan | 257/693 |
| 3-225946 | 10/1991 | Japan | 257/697 |

*Primary Examiner*—P. W. Echols
*Attorney, Agent, or Firm*—Katz & Cotton, LLP

[57] ABSTRACT

A ball bump grid array package includes dies on one surface of a printed wiring board (PWB) and an array of ball bumps on the other surface of the PWB. The die is interconnected with the ball bumps by bond wires, traces on the one surface of the PWB, vias through the PWB and traces on the other surface of the PWB. Various die encapsulation schemes are discussed. The PWB is formed of FR4, BT, teflon or polyimide, or ceramic materials. The die may be connected to the traces on the one surface of the PWB with solder balls, rather than with bond wires. Two or more dies may be disposed on the one surface of the PWB, within the plastic molded body. The ball bumps on the other surface of the PWB may be arranged in a multiple grid pitch array—ball bumps within a central area being on a first pitch, and ball bumps without the central area being on a second pitch which is a multiple of the first pitch.

12 Claims, 11 Drawing Sheets

METHOD OF ASSEMBLING BALL BUMP GRID ARRAY SEMICONDUCTOR PACKAGES

CROSS-REFERENCE TO RELATED APPLICATIONS

This is a continuation of U.S. patent application Ser. No. 08/382,147, filed Feb. 1, 1995, now abandoned, which was a divisional of U.S. patent application Ser. No. 07/938,690, filed Sep. 1, 1992 now abandoned, which was a continuation-in-part of U.S. patent application No. 07/917,894, filed Jul. 21, 1992 now abandoned.

TECHNICAL FIELD OF THE INVENTION

The invention relates to packaging semiconductor devices and, more particularly, to grid array type semiconductor packages.

BACKGROUND OF THE INVENTION

In order to handle and connect a semiconductor die (integrated circuit device) to external systems, it is generally necessary to package the die. This usually involves mounting the die to some sort of substrate, leadframe or carrier, connecting bond pads on the die to some sort of conductive lines or traces and forming a package body around the die. The conductive lines or traces exit the package body, and usually terminate in external leads or pins.

For example, ceramic packages have a package body with a central opening (cavity) in one face for receiving the die, and lead fingers embedded in the body and extending into the opening. The die is connected (usually wire bonded) to the exposed (in the opening) portions of the lead fingers. The lead fingers are connected (internally in the package) to pins exiting a planar surface of the package. These pins are typically arranged in a rectangular (e.g., square) array. This type of packaging is expensive, and involves several elements for the ceramic package, not the least of which is the pins. In some instances, the die-receiving cavity is "up", on one face of the package body, and the pins are on the other, opposite face of the package body. In other instances, the die-receiving cavity is "down", on the same face of the package as the pins (in which case there are no pins in the area of the cavity). (The pins are deemed to be on the "bottom" of the ceramic body.)

In another example, the die is attached and connected (usually wire bonded) to a relatively rigid (thick) lead frame having several conductive lines, and a plastic body is molded around the die and inner ends of the conductive lead frame lines. Outer ends of the lead frame lines exit the plastic body on two or four sides. The leads may be closely spaced and delicate, demanding extreme care in handling to avoid lead skew and the like. Co-planarity (more correctly, lack thereof) is a problem with this, or any type of leaded (having external leads) package.

In another example, the die is attached to a relatively flexible (thin) lead frame supported by a plastic tape, and is encapsulated in epoxy or the like. Outer ends of the lead frame lines exit the epoxy body. These leads are even more fragile than those of plastic packages. Both wire bonding and tape-automated bonding of the die to the lead frame lines are well known in tape packages.

Another packaging technique is mounting the die directly to a printed circuit board (PCB; also referred to as PWB, or printed wiring board) substrate. The die is connected (typically wire bonded) to one end of conductive traces on a face (surface) of the PCB. Another end of the trace is connected to a pin, a separate external lead, or the like.

A recent development in semiconductor packaging is exemplified by Motorola's "OMPAC", or Overmolded Plastic Pad Array Carrier.

Figure 1:
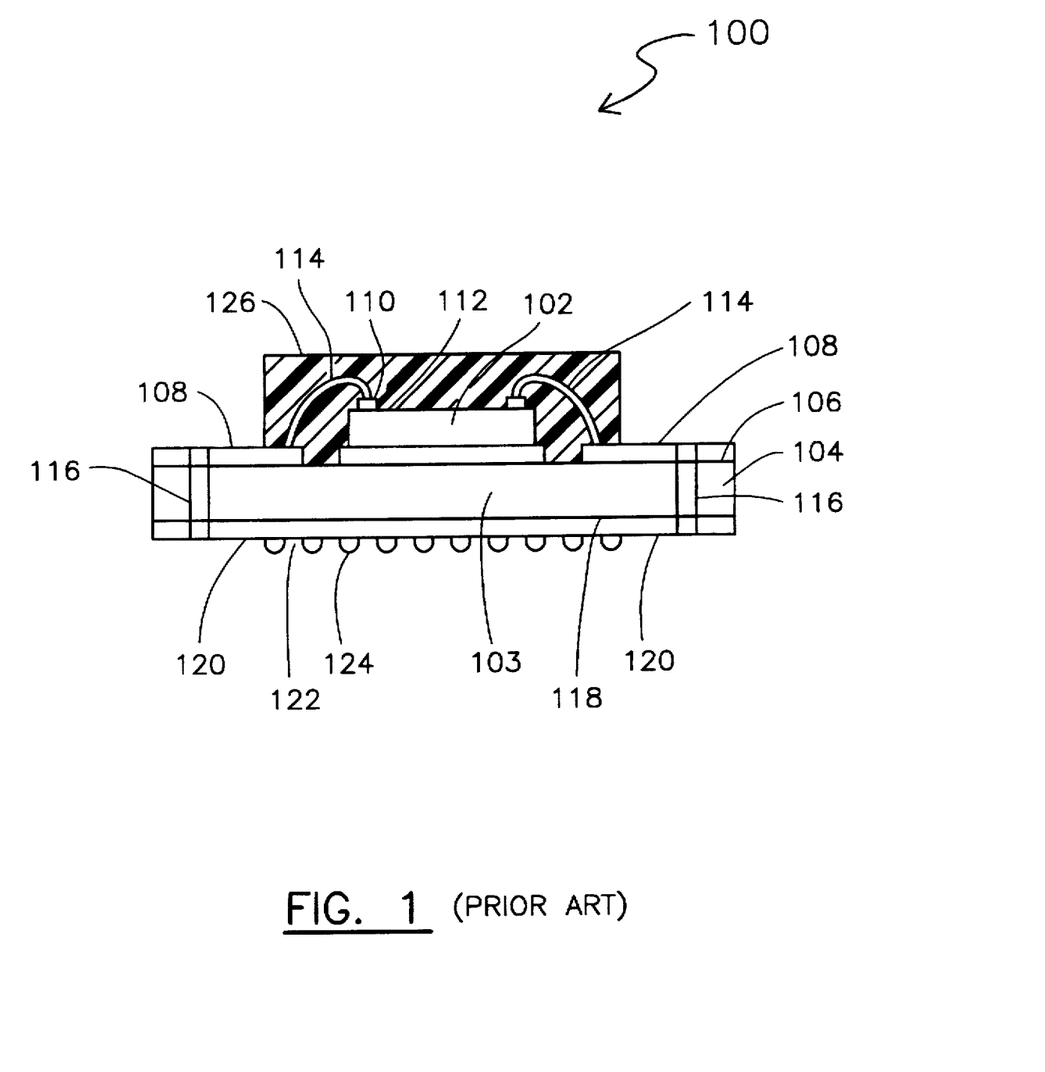
FIG. 1 is a cross-sectional view of a prior art bump-grid array semiconductor package.
Figure 2:
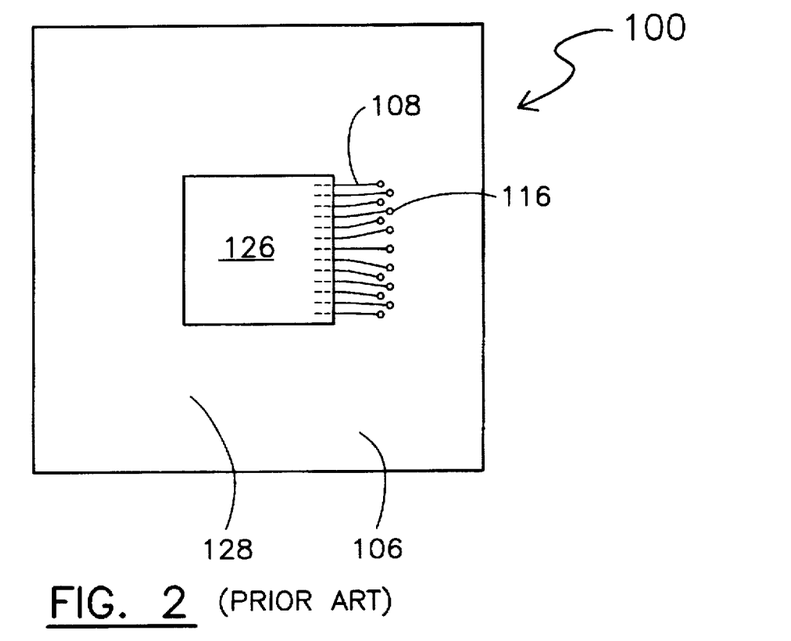
FIG. 2 is a top view of the bump-grid array package of FIG. 1.
Figure 3:
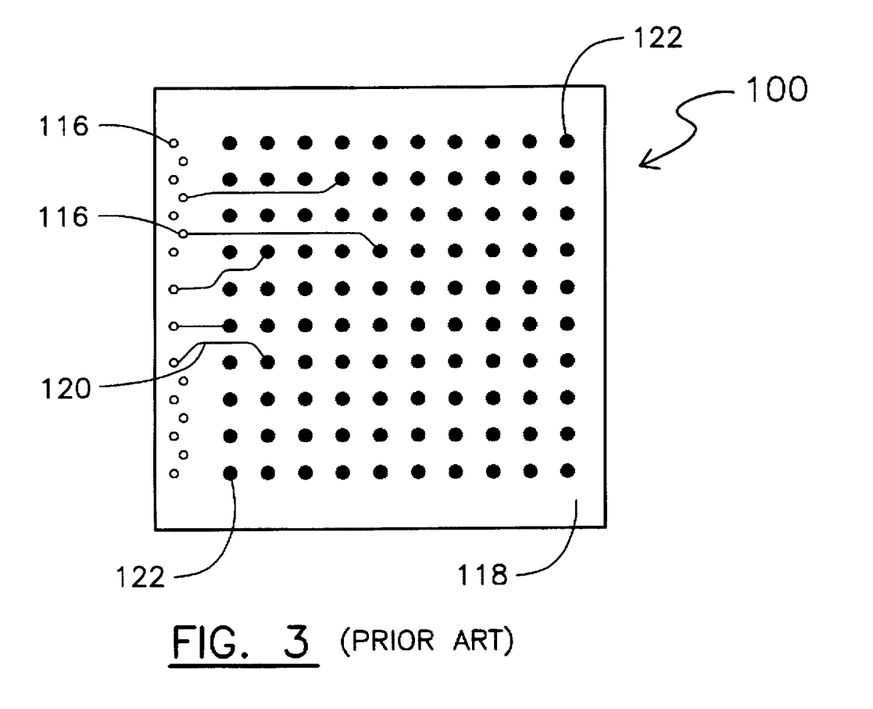
FIG. 3 is a bottom view of the bump-grid array package of FIG. 1.

FIGS. 1, 2 and 3 illustrate Motorola's OMPAC 100. A semiconductor die 102 is mounted face-up in a central area 103 of a printed circuit board (PCB) 104. The PCB is larger than the die. The top surface 106 of the PCB is provided with a number of conductive traces 108 that extend from near the periphery of the PCB to the central area. The die has bond pads 110 on its face 112. Bond wires 114 extend from these bond pads to inner ends of the traces 108. Near the periphery of the PCB, there are plated (conductive) through-holes (vias) 116 extending from the back side 118 of the PCB, through the PCB to a respective trace 108. The back side 118 of the PCB is provided with a number of conductive traces 120, each having an end connected with a respective via 116. In this manner, signals (and power) to and from the die are connected through the bond wires 114, through the top side traces 108, through the vias 116, to the bottom side traces 120. A plastic molded body 126 is formed over the die, and partially covers the top surface of the PCB. This is best viewed in FIG. 2, which shows a few of many top surface traces 108 exiting the package body 126 and terminating at vias 116. (Traces 108 would be disposed all around the body 126.)

As best viewed in FIG. 3, each of the bottom side traces 120 (only a few of many such traces shown, for illustrative clarity) originates at an associated via 116 (only a few of many such vias all around the periphery of the PCB are shown, for illustrative clarity), and terminates at a "site" (particular location) 122 (darkened dots) on the bottom surface 118 of the PCB. The sites 122 are arranged in a rectangular array of evenly spaced rows and columns. As best viewed in FIG. 1, each site 122 is provided with a solder bump (ball bump) 124. The ball bumps constitute the external connections for the package (assembly) 100. In this manner, the entire assembly 100 can be surface-mounted to a corresponding "mother board"—in other words, to a circuit board containing other circuit elements and the like for integrating the assembly 100 into an electronic system (not shown). This type of package can be considered to be a "ball bump grid array" type package, as opposed to a pin grid array or a leaded package.

Returning to FIG. 1, the die 102 is encapsulated in plastic mold compound forming the body 126. The mold compound encapsulates the die 102, the bond wires 114, and the inner ends of the top traces 108. Notably, the mold compound, or "package body", does not completely cover the top surface of the PCB 104. Rather, the package body 126 extends only partially towards the periphery of the PCB, and a peripheral area 128 (see FIG. 2) of the PCB remains unencapsulated.

Such "partial" coverage of the PCB 104 by the molding compound results in a package body 126 that can delaminate (separate) from the substrate (PCB) when the molded body shrinks after molding. Consequently, moisture can penetrate onto the chip along the delamination interface (plane between molded body and PCB) and cause reliability failures.

Further, in order to perform this type of "partial" molding (body 126 on PCB 104), non-conventional molding equipment is required. The gate for injecting the mold compound cannot be at the parting line of the mold. The mold will thus have a cavity plate that needs to be removed from the mold press to unload the package. (The mold would be a three-part design with a cavity plate section that has to be removed from the mold to remove the completed package.)

There remains significant areas for improvement of OMPAC, and for applying the benefits of ball bumps to other types of semiconductor packages.

DISCLOSURE OF THE INVENTION

It is an object of the present invention to provide an improved semiconductor device assembly.

It is another object of the present invention to provide a bump-grid array type package that is mechanically stronger than a partially molded package (such as OMPAC), i.e., that does not suffer from delamination and reliability problems.

It is another object of the present invention to provide a bump-grid array type package that can be molded using traditional two-part molds, with the gate(s) along the parting line of the mold.

It is a further object of the present invention to provide a various enhancements to ball bump grid array packages.

It is a further object of the present invention to provide novel ball bump grid array packages.

According to the invention, a ball bump grid array package is formed by a die on one surface of a printed wiring board (PWB) and an array of ball bumps on the other surface of the PWB. The die is interconnected with the ball bumps by bond wires, traces on the one surface of the PWB, vias through the PWB and traces on the other surface of the PWB. A plastic body is molded over the die, and covers the entire one surface of the PWB. Preferably, the molded body overhangs the side edges of the PWB.

According to an aspect of the invention, a plastic body molded over a die on a PWB is provided with slits, as strain reliefs.

According to another aspect of the invention, the PWB is formed of FR4, BT, teflon or polyimide.

According to another aspect of the invention, the die is connected to the traces on the one surface of the PWB with solder balls, rather than with bond wires.

According to another aspect of the invention, two or more dies are disposed on the one surface of the PWB, within the plastic molded body.

According to another aspect of the invention, the ball bumps on the other surface of the PWB are arranged in a multiple grid pitch array—ball bumps within a central area being on a first pitch, and ball bumps without the central area being on a second pitch which is a multiple of the first pitch.

Other objects, features and advantages of the invention will become apparent in light of the following description thereof.

DETAILED DESCRIPTION OF THE INVENTION

FIGS. 1, 2 and 3 show a bump-grid array type semiconductor package of the prior art, and have been discussed hereinabove. The mechanical problem of delamination of the package body from the PC substrate, and the difficulties in molding such a package body configuration have been discussed hereinabove.

PLASTIC/PWB PACKAGES

Figure 4:
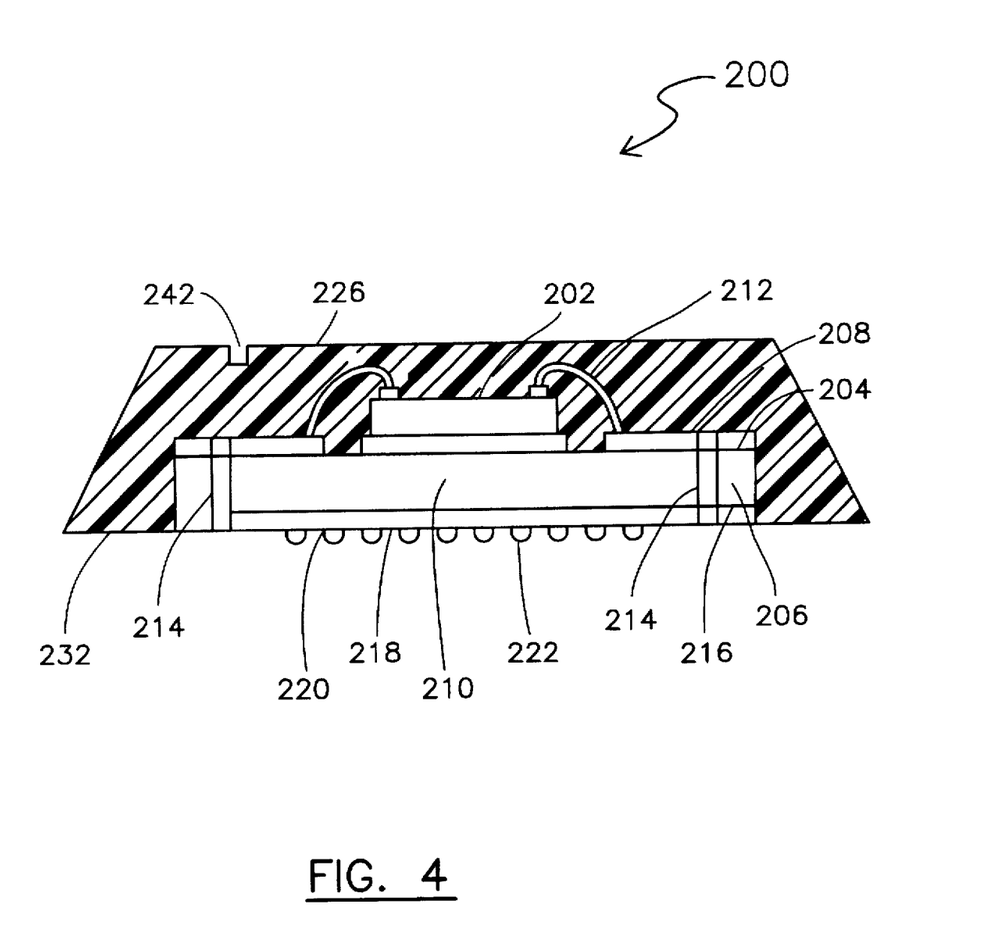
FIG. 4 is cross-sectional view of a ball bump grid array package, according to the present invention.
Figure 5:
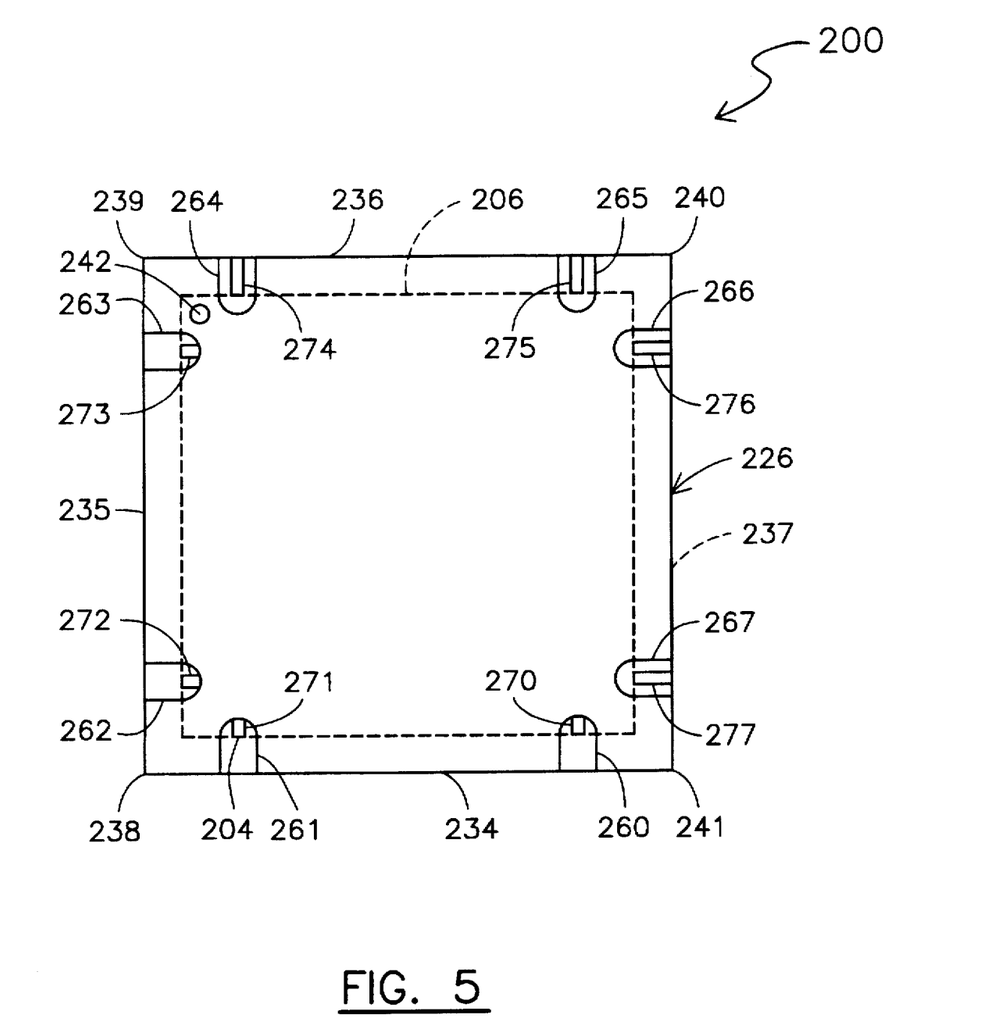
FIG. 5 is a top view of the package of FIG. 4.
Figure 6:
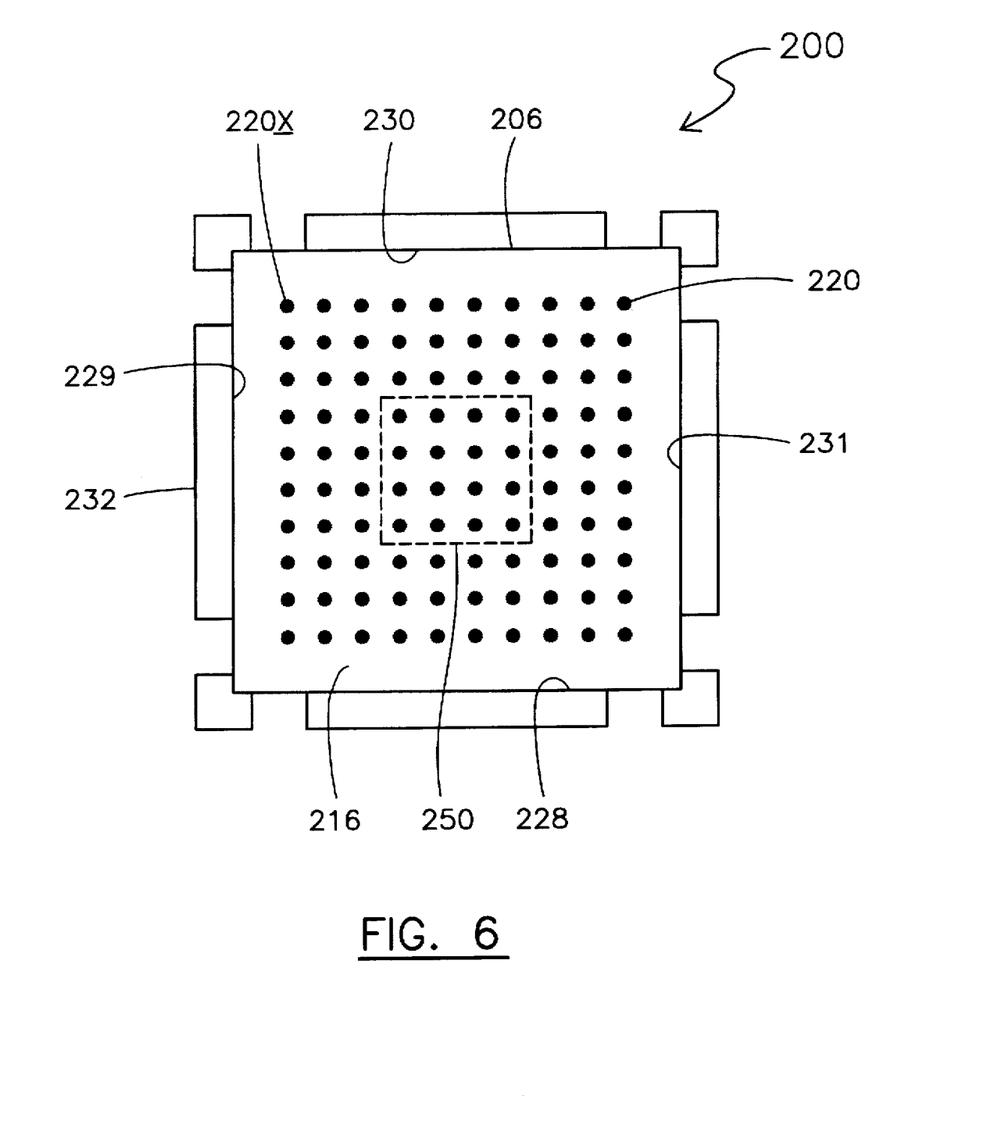
FIG. 6 is a bottom view of the package of FIG. 4.

FIGS. 4, 5, and 6 show an embodiment of the ball bump grid array semiconductor package 200 of the present invention. A semiconductor die 202 is mounted to the top surface 204 of a printed wiring (circuit) board (PWB) 206. The top surface 204 of the PWB 206 is provided with a plurality of conductive traces 208 extending from near the periphery of the PWB to a central area 210 whereat the die is mounted. The die is wire bonded with bond wires 212 to inner ends of the traces 208. Plated through-holes 214 are provided through the PWB, from the top surface 204 to the bottom surface 216 thereof. Each via 214 is aligned with a respective one of the top surface traces 208. A plurality of conductive traces 218 on the bottom surface 216 of the PWB each extend from a respective via 214 to a site (particular location) 220 on the bottom surface of the PWB. The sites 220 are arranged in a rectangular array. Each site is provided with a solder ball (bump) 222. In these respects, the package 200 is similar to the OMPAC 100.

According to the invention, a plastic body 226 is molded over the die 202, bond wires 212, and over the entire top surface 204 of the PWB. As best viewed in FIGS. 4 and 6, the body 226 extends beyond the peripheral edges of the PWB, and over the four side edges 228, 229, 230, 231 thereof. Preferably, a portion 232 of the body 226 extending over the side edges of the PWB is flush with the bottom surface 216 of the PWB. In this manner, the entire package body 226 can be molded in a conventional two-part mold set (not shown), with the bottom surface 216 of the PWB located at the parting line of the mold. Further, with the body 226 "fully" (rather than partially) covering the top surface of the PWB, and overhanging the side edges thereof, the body 226 is more intimately mechanically mated to the PWB. There is greater (i.e., maximum) surface area for adhesion of the body to the front surface of the PWB, and shrinkage of the body 226 is restrained by the portions 232 of the body 226 overhanging the side edges 228–231 of the PWB. Hence, the package 200 of the present invention is superior (e.g., with respect to ease of molding, mechanical integrity and reliability) to the package 100 of the prior art.

As best viewed in FIG. 6, the ball bumps 220 are arranged in a regular rectangular array or rows and columns, evenly spaced from one another. The distance "d" between the center of one ball bump 220 and the center of the next adjacent ball bump in a given row or column can be established to be any convenient dimension. For example, 0.050 inches. This allows for ball bumps 220 having a diameter "r" of 0.040 inches, with 0.010 inches space "s" between adjacent ball bumps in a given row or column. (The space "s" between one ball bump 220a and a diagonally opposed bump in another row or column in evidently s √2.)

As best viewed in FIG. 4, the height "h" of each ball bump 220, in other words the distance above (below) the bottom surface of the overall package, is preferably on the order of 0.025 inches, plus/minus 0.007 inches (i.e., 0.018–0.032 inches).

Figure 7:
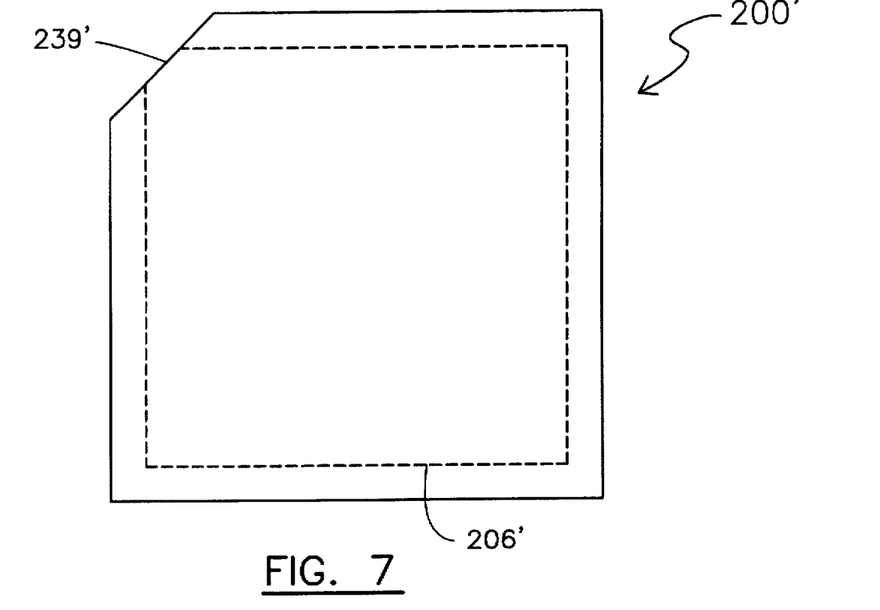
FIG. 7 is a top view of an alternate embodiment of the package of FIG. 4.

As best viewed in the top view of FIG. 5, the package body 226 has four side edges 234, 235, 236 237, and four corners 238, 239, 240, 241. Preferably, the corner 239 at the junction of the side edges 235 and 236 is provided with a molded indentation 242 (see also FIG. 4), or other visually distinguishing characteristic (such as an out-dentation, or bump) to identify the orientation of the package 200 (which corner is which). Alternatively, an entire portion of the corner 239 (or any given corner) could be cut away (or simply not molded in the first place) to provide a similar visual cue as to the orientation of the package 200, as shown in FIG. 7. In FIG. 7, a package 200', similar to the package 200, has a corner 239' cut away for identification of package orientation. This cut can extend through the PWB 206' to the extent that the cornermost ball bump at this cut away corner would be eliminated (see, e.g., the ball bump 220x in FIG. 6).

Figure 8:
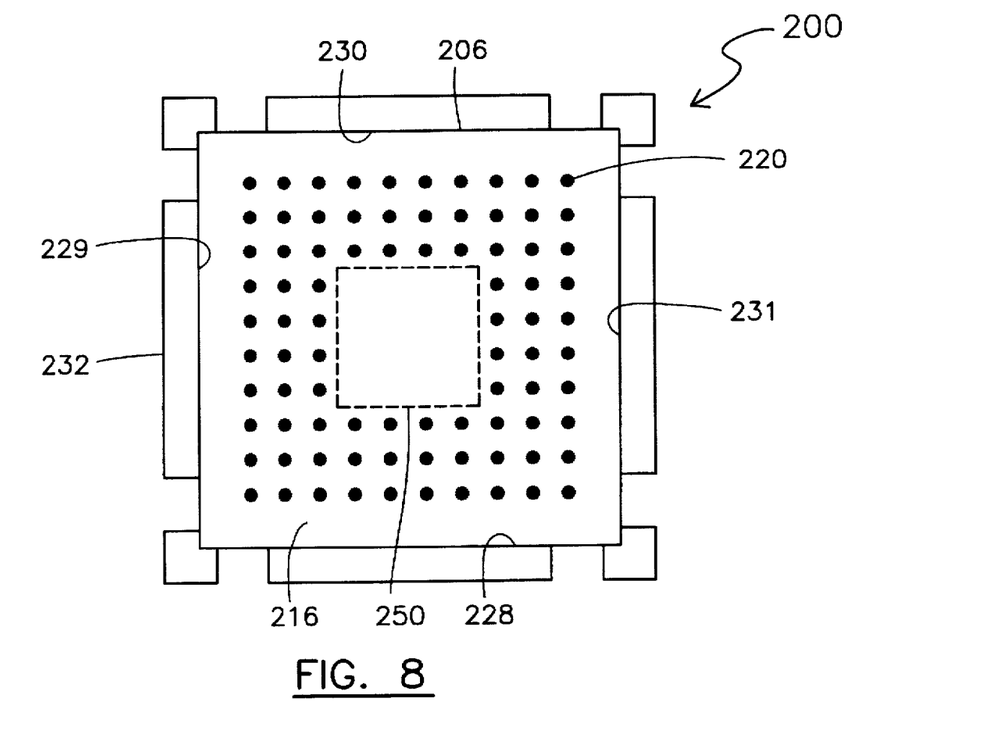
FIG. 8 is a bottom view of an alternate embodiment of the package of FIG. 4.

As best viewed in FIG. 6, a central area on the bottom surface of the PWB, within dashed line 250 is "populated" with ball bumps 220. However, in certain applications, as will be evident hereinbelow, it may be preferred to leave this area void of ball bumps, as shown in FIG. 8. This area coincides, generally, with the area on the top surface of the PWB to which the die is mounted. An area 252 outside of the area 250 is provided with ball bumps 220. This is a "partially populated" ball bump grid array.

Returning to FIGS. 5 and 6, it is shown that the side edges of the body 226 are provided with notches 260, 261, 262, 263, 264, 265, 266, 267, two notches per side edge. These notches can be formed as part of the molding process, and extend fully through the overhanging (i.e. overhanging the PWB) portion 232 of the body 226, and partially onto the top surface of the PWB 204, which can be seen exposed in the notches 260–267. These notches serve at least two distinct purposes:

(a) The notches 260–267 serve as strain reliefs to prevent (accommodate) mechanical strains experienced during the cooling off of the plastic molded body 226, after molding.

(b) The notches 260–267 serve as a strain relief to compensate for unequal coefficients of thermal expansion between the PWB 204 and the body 226 when the device 202 is operating and generating heat.

(c) additional traces 270–277 (other than the traces 208 previously mentioned) on the top surface of the PWB are exposed in the notches 260–267, and can provide for connection to the die from the top of the package 200 for power, ground and the like (as contrasted with the remaining connections on the bottom of the package via the ball bumps 220.) Alternatively, chip capacitors can be disposed in the notches, across two traces.

Figure 9A:
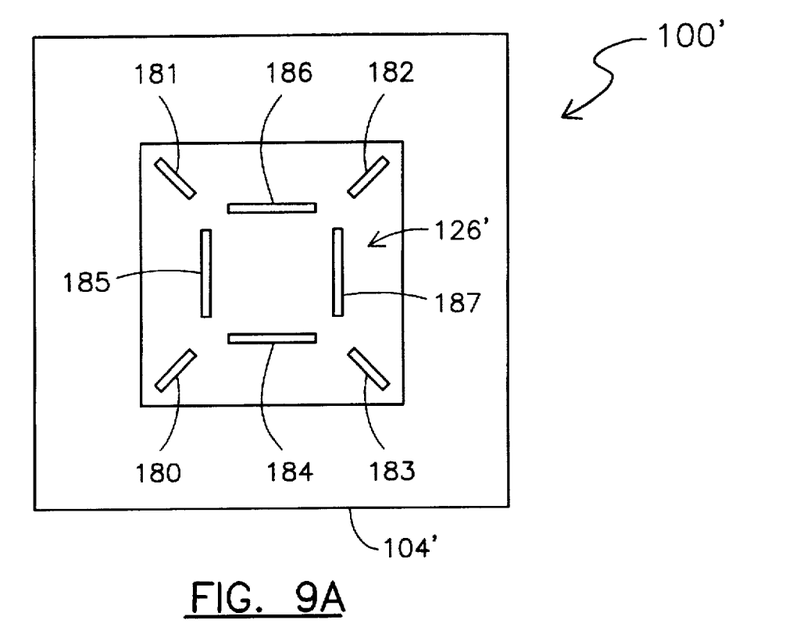
FIG. 9A is a top view of an improvement to the prior art package of FIG. 1.

FIG. 9A shows a technique for dealing with unequal coefficients of thermal expansion, shrinkage, and other mechanical problems associated with the partially molded OMPAC 100 of the prior art (compare FIGS. 1 and 2). In this package 100', the molded plastic body 126' is provided with a number of molded-in slits 180–187 extending from the exterior surface of the body 126' at least partially into the body towards the underlying PCB 104'. The slits 180–183 are disposed from adjacent the corners towards the center of the body. The slits 184–187 are disposed parallel to the sides of the body. The slits may also extend fully through the body to the PCB.

Figure 9B:
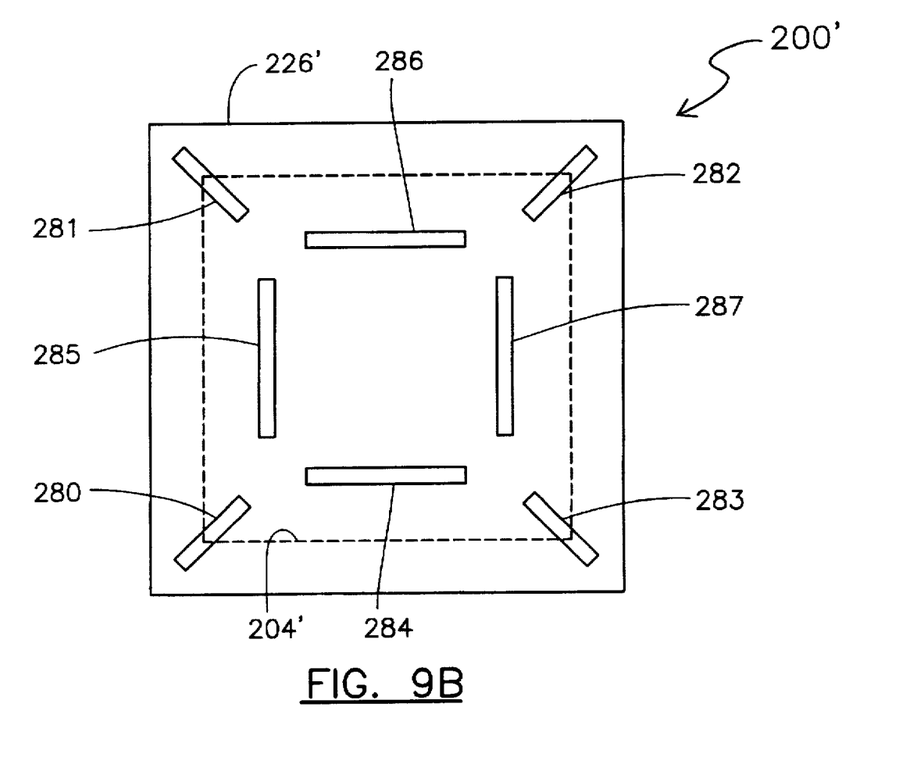
FIG. 9B is a top view of an alternate embodiment of the package of FIG. 4.

FIG. 9B shows a similar arrangement of slits 280–287 extending into the plastic body 226' of a fully molded package 200', such as the package 200 of FIG. 4. Again, the slits may extend only partially, or fully, to the underlying PWB 204'.

Figure 10A:
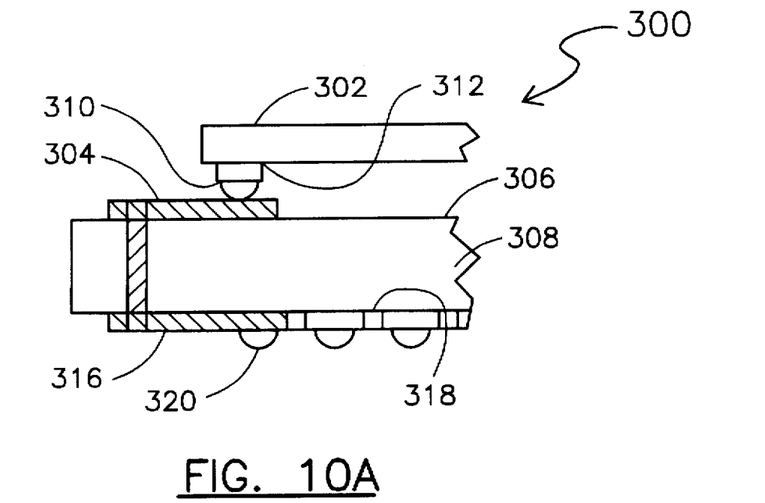
FIG. 10A is a cross sectional view of an alternate embodiment of the package of FIG. 4.

FIG. 10A shows an alternate embodiment 300 of a ball bump grid array. In this case, a die 302 is connected to traces 304 on the top surface 306 of PWB 308 by way of solder bumps 310, rather than with bond wires (compare 114, 212). To this end, the die 302 is disposed "upside down" (compare 102, 202), and has bond pads 312 on its bottom (as viewed) surface. The solder bumps 310 may be formed either on these pads 312, on similar pads at the inner ends (portion underlying the die) of the traces 304, or on both. Plated through holes 314 are provided to connect the top traces 304, exterior the die area, to traces 316 on the bottom surface 318 of the PWB. Other ends of the traces 316 terminate in sites for solder balls 320. The die 302 is mounted and connected to the PWB by heating the assembly sufficiently, to a first temperature, to reflow the solder balls 310. Then, a plastic body (not shown) is formed around the die and over the top surface of the PWB. For mounting the package 300 to a mother board (not shown) the entire assembly 300 is positioned on the mother board, and heated to a second temperature, lower than the first temperature, to reflow the solder balls 320 (at this stage, it is not desired to reflow the solder balls 310). This package may be formed with a molded body partially covering the PCB, such as the body 126 (FIG. 1), or with a plastic body fully covering the PWB, such as the body 226 (FIG. 4), and can be provided with notches (FIGS. 5 and 6) and/or with slits as set forth in FIGS. 9A and 9B.

Although application of ball bumps to a two sided PWB is described hereinabove, it will be understood by those skilled in the art that this technique is equally applicable to multi-layer PWBs.

Figure 10B:
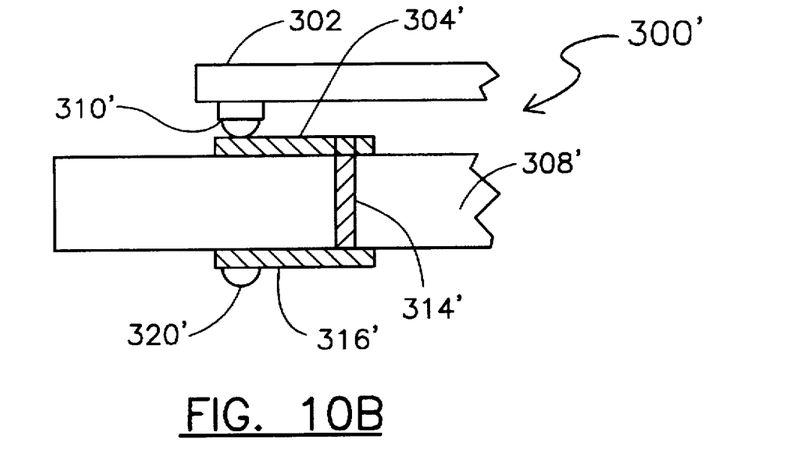
FIG. 10B is a cross sectional view of an alternate embodiment of the package of FIG. 10A.

FIG. 10B shows an alternative 300' to FIG. 10A. In this case, top surface traces 304' are disposed entirely under the die 302, on a PWB 308'. These traces 304' are connected at one end to via solder balls 210' to the face of the flipped over die 302. The other ends of these traces 304' are connected by way of plated through vias 314' to one end of traces 316' on the lower surface of the PWB. Ball bumps 320' are disposed at the other ends of the traces 316'. As mentioned, the traces 304' are very short, and are disposed entirely in the area directly under the die 302 (rather than extending out of this area, as in FIG. 10A). Other top surface traces, not shown, may extend out from this area (as in FIG. 10A). Notably, in this embodiment, the vias 314' are offset from either the solder balls 310' or the ball bumps 320'. In this manner, the vias 314' will not tend to "wick" solder into the through hole (e.g., by capillary action). Else, if the vias were aligned with (not offset from) the solder balls 310' or ball bumps 320', wicking of solder into the via would decrease the reliability of the respective electrical and mechanical connections effected by these elements.

Figure 11:
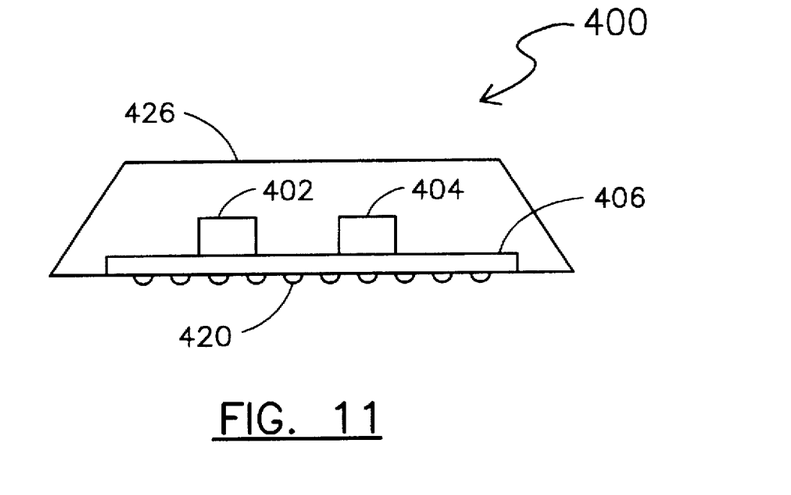
FIG. 11 is a cross sectional view of an alternate embodiment of the package of FIG. 4.

FIG. 11 shows another use for the various packaging techniques set forth in FIGS. 4–10B. For clarity, only the essential elements of this embodiment 400 are illustrated. More particularly, in this embodiment, two dies 402 and 404 are mounted to a single PWB substrate 406, and are encapsulated by a plastic molded body 426. An array of ball bumps 420 is provided on the bottom surface of the PWB. The dies are connected to the ball bumps by means of traces on the top and bottom of the PWB, as set forth hereinabove. The dies can be face up, for wire bonding to top surface traces, or can be face down for solder ball bonding to top surface traces.

Figure 12:
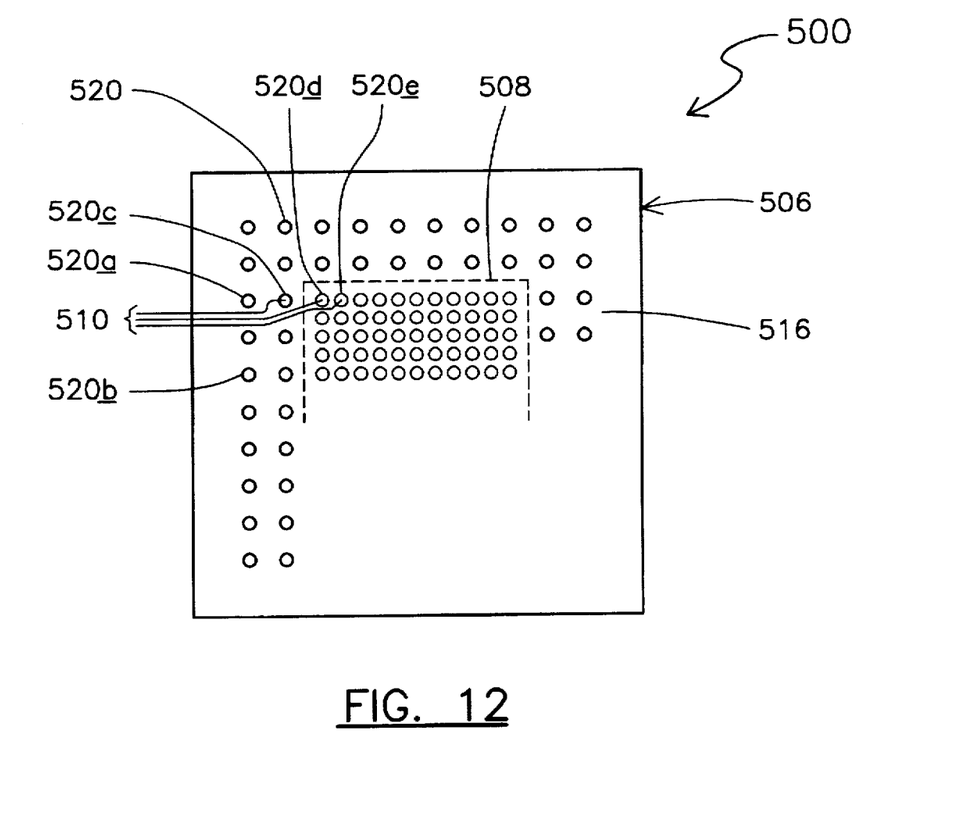
FIG. 12 is a bottom view of an alternate embodiment of the package of FIG. 4.

FIG. 12 shows an alternate embodiment 500 of the invention. Again certain elements already discussed hereinabove are omitted for clarity. The bottom surface 516 of a PWB 506 is provided with an array of ball bumps 520. Whereas, in FIG. 6, a regular rectangular array of evenly-spaced ball bumps on the bottom surface of the PWB was illustrated, according to this aspect of the invention it is beneficial if the ball bumps are not evenly spaced. For example, as shown in FIG. 12, in a central area of the bottom surface of the PWB, indicated by dashed line 508, the ball bumps 520 are spaced at a first pitch, for example 0.050 inches (center-to-center). The problem addressed here is that the conductive traces on the motherboard, shown herein as lines 510 superposed on the bottom surface of the PWB, generally originate from outside of the "footprint" of (area on the motherboard occupied by) the package. In order for these traces 510 to reach the innermost ball bumps of the package (namely, to reach pads on the motherboard corresponding to these ball bumps on the package), some of the traces 510 must pass by (between) all of the ball bumps (and motherboard pads) disposed more towards the periphery of the package. Three such traces 510 are illustrated passing between several two peripherally located ball bumps 520a and 520b, to reach three more inwardly located ball bumps 520c, 520d and 520e. Evidently, if all of the ball bumps were located with the same "pitch" (center-to-center distance on a given row or column), the pitch of the ball bumps will be limited by how many motherboard traces (of a given size) can fit between corresponding pads for the outermost ball bumps. Therefore, according to the invention, the pitch of ball bumps within the central area of the package (within 508) is established at a first, "fundamental" pitch, such as 0.050 inches. The pitch of ball bumps without the central area (outside the line 508) is a second, multiple of the "fundamental" pitch, such as 0.100 inches. In this manner, outermost rows and columns of ball bumps (and corresponding pads on the motherboard) are spaced to allow for a greater number of motherboard traces to "fanout" from a central area of the array.

According to the invention, various materials may be selected for the PWB. For example: FR4 or BT resin (traditional PWB substrate materials), or teflon and polyimide. The selection of one of these materials will depend on the particular environment for which the packaged die is intended to be used, taking into account such factors as hermeticity, cost, dielectric constants, and any number of other factors that may be pertinent. One skilled in the art to which this invention most nearly pertains will be able to ascertain which material is best suited for a given application, based on the teachings set forth herein.

Figure 13A:
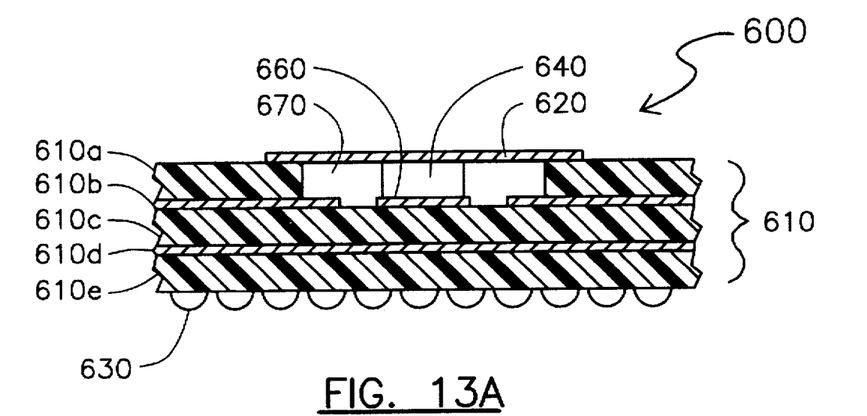
FIG. 13A is a cross-sectional view of an alternate embodiment of a ball bump grid array package according to the present invention.

FIG. 13A shows another alternate embodiment 600 of the invention wherein a die 640 is mounted to a die attachment pad 660 in a body 610 with a cavity 670. Body 610 is made up of a "sandwich" of alternating insulating and patterned electrically conductive layers, whereby a top insulating layer 610a has a hole located substantially in its center which forms the cavity 670 into which the die 640 is disposed. (Presumably there are electrically conductive vias provided between the patterned conductive layers forming electrical connections therebetween). Immediately below insulating layer 610a in body 610 is a conductive layer 610b which is formed of a patterned electrically conductive material. The pattern of this material forms conductive traces which extend into the cavity 670, and die attachment 660 located substantially in the center of the cavity. Die 640 is bonded to die attachment pad 660, and connects to the conductive traces with bond wires (not shown here, for illustrative simplicity, but shown with respect to the embodiment of FIG. 4). Immediately below patterned conductive layer 610b is an insulating layer 610c which forms the bottom surface of the cavity 670. A lid 620 covers and seals the cavity 670. Immediately below insulating layer 610c is a patterned conductive layer 610d. Finally, immediately below patterned conductive layer 610d is an insulating layer 610e, which forms the bottom surface of body 610. A plurality of ball bumps 630 (solder bump electrical terminals) are disposed on the bottom surface of insulating layer 610e by means described hereinabove. In this embodiment, (a cavity-up orientation) the entire bottom surface of the body 610 is available for ball bumps 630.

Figure 13B:
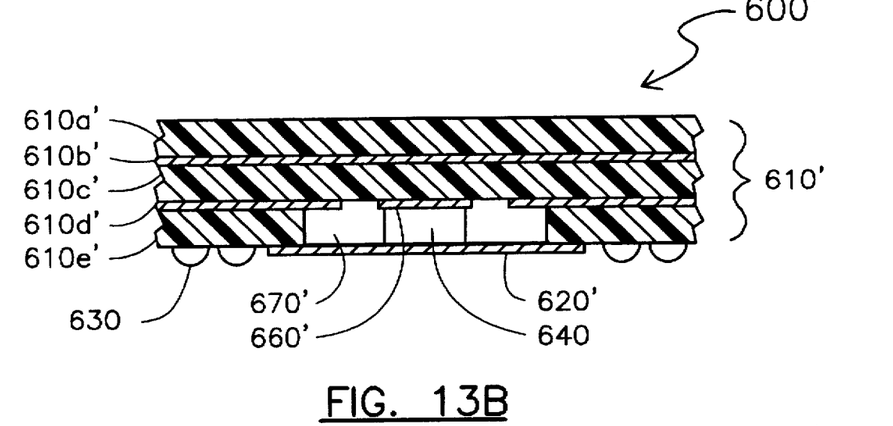
FIG. 13B is cross-sectional view of an alternate embodiment of the package of FIG. 13A.

FIG. 13B shows an alternate embodiment 600' of the package of FIG. 13A wherein cavity 670' is oriented in a downward position on the same side of the body 610' as the ball bumps 630. Body 610' is made up of alternating insulating layers (610a', 610c' and 610e') and patterned conductive layers (610b' and 610d'), similar to the corresponding layers in FIG. 13A. In this embodiment, however, it is the bottom insulating layer 610e' which has a hole forming cavity 670', and the next higher insulating layer 610c' forms the top of the cavity 670'. Ball bumps 630 are diaposed on the bottom surface of insulating layer 610e'. Patterned conductive layer 610d provides the electrical connection points and die attachment pad for die 640, which is oriented upside-down relative to its orientation in FIG. A.

A lid 620' covers and seals cavity 670'. Because of the position of lid 620', ball bumps 630 may not be placed in the immediate vicinity of lid 620', thus reducing the number of electrical terminations relative to the embodiment of FIG. 13A. However, lid 620' does provide at least one benefit, described hereinbelow with respect to FIG. 13C.

Figure 13C:
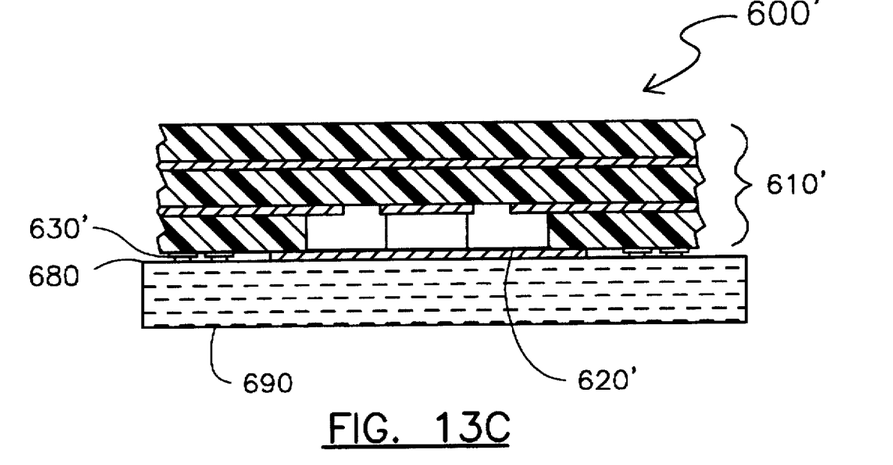
FIG. 13C is a cross-sectional view of the package of FIG. 13B assembled to a printed circuit board.

FIG. 13C shows the embodiment (package) 600' of FIG. 13B assembled to a circuit board 690 by reflow soldering. In this configuration, lid 620 acts as a spacer between body 610' and circuit board 690. Circuit board 690 has conductive pads 680 positioned such that they align with the ball bumps (shown as 630' in their re-flowed state) on body 610'.

For the embodiments of FIGS. 13A–C, it is also possible to use the bump mounting arrangement shown in FIGS. 10A–B to attach and connect the die 640.

Figure 14A:
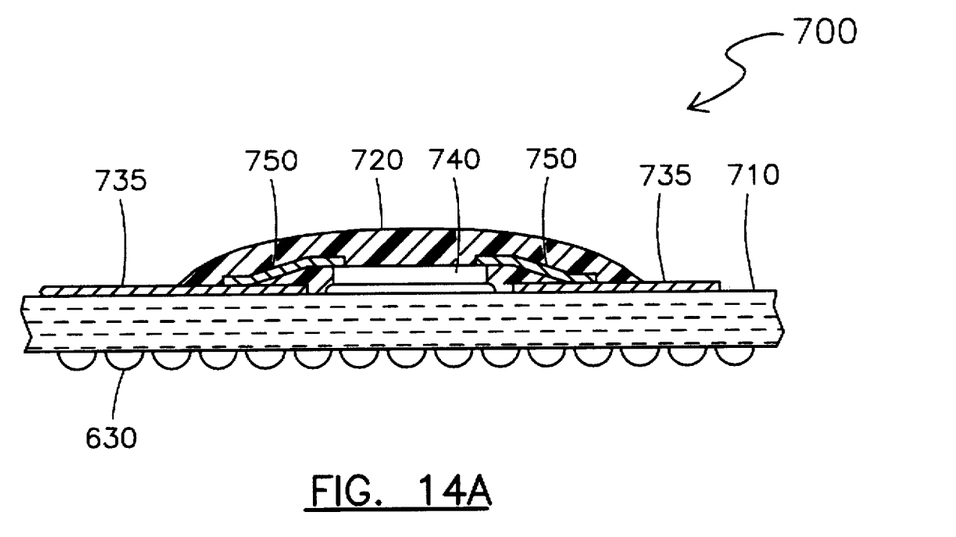
FIG. 14A is a cross-sectional view of still another alternate embodiment of a ball bump grid array package, according to the present invention.

FIG. 14A shows yet another alternate embodiment 700 of a package embodying the principles of the present invention, wherein a die 740 is attached to a printed circuit board substrate using chip-on-board techniques known to those skilled in the art. In this embodiment, a die 740 is mounted to a die attachment pad on the top surface of a printed circuit board substrate 710. Printed circuit board substrate 710 has conductive traces 735 on at least its top surface. These traces 735 approach die 740 in a generally radial pattern, providing electrical connection points which are connected to die 740 via bond wires 750. After bond wire connections have been made, an epoxy glob 720 is disposed over the die and the bond wires, forming a protective encapsulation of the die 720 and bond wires 750. Ball bumps 630 are disposed on the bottom surface of the printed circuit board substrate, providing electrical termination points. Ball bumps 630 are deposited and connected to conductive traces 735 by means described hereinabove.

Figure 14B:
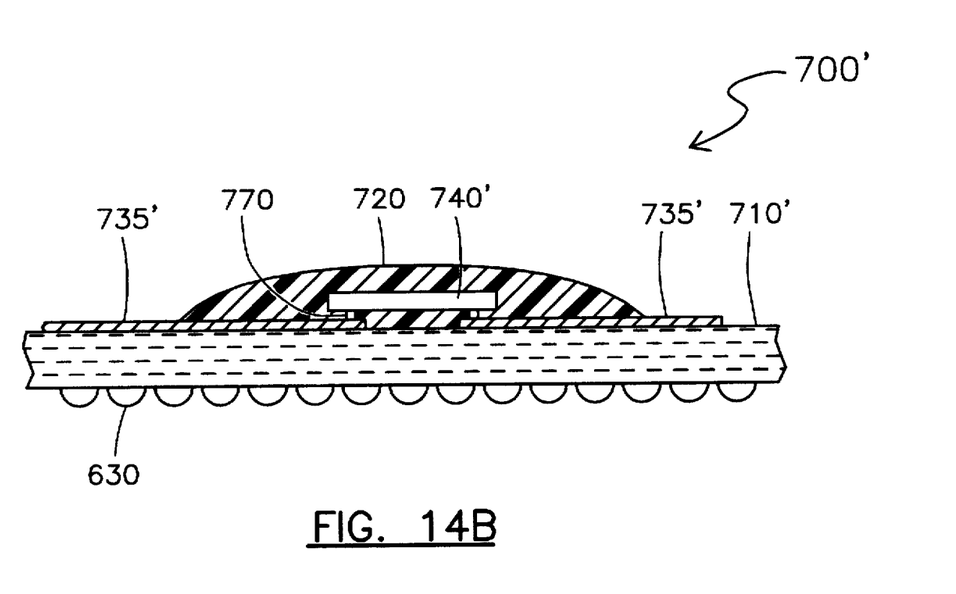
FIG. 14B is a cross-sectional view of an alternate embodiment of the package of FIG. 14A.

FIG. 14B shows an alternate embodiment 700' of the package of FIG. 14A, using the die attachment scheme describe with respect to FIGS. 10A and 10B. In this embodiment, a die 740' is bump mounted to conductive traces 735' on a top surface of a printed circuit board 710'. The traces 735' approach the area under die 740' in a pattern which aligns exactly with solder bumps 770 disposed on die 740' These solder bumps are re-flowed, as described hereinabove, forming electrical and mechanical connections with conductive traces 735'. Ball bumps 630 are disposed on the bottom surface of printed circuit board substrate 710' and connected to conductive traces 735 by means described hereinabove.

For the embodiments of FIGS. 13A–C and FIGS. 14A–B, the printed circuit boards may be made of any suitable material, such as FR4 or BT resin (traditional printed circuit board materials), teflon, or polyimide. Alternatively, ceramic materials may be used, particularly for the embodiments of FIGS. 13A–B.

The completed semiconductor package of any of the embodiments set forth above, including the die and package body, is termed "semiconductor device assembly."

What is claimed is:

1. A method for assembling a semiconductor device, comprising the steps of:
    providing a printed wiring board (PWB) substrate having a top surface, a bottom surface, and side edges, the top surface having a top peripheral area, and a top central area within the top peripheral area, the bottom surface having a bottom peripheral area, and a bottom central area within the bottom peripheral area;
    disposing top conductive traces on the top surface of the PWB substrate, the top conductive traces extending from the top peripheral area of the top surface of the PWB substrate towards the top central area of the top surface of the PWB substrate;
    disposing bottom conductive traces on the bottom surface of the substrate;
    extending conductive vias through the substrate, wherein the conductive vias connect the top conductive traces to the bottom conductive traces;
    disposing a first portion of conductive pads in the bottom central area of the bottom surface of the substrate, the first portion of conductive pads having a first pitch, wherein each pad of the first portion connects to a respective trace of the bottom conductive traces;
    disposing a second portion of conductive pads in the bottom peripheral area of the bottom surface of the substrate, the second portion of conductive pads having a second pitch; wherein each pad of the second portion connects to a respective other trace of the bottom conductive traces and wherein the second pitch is greater than the first pitch;
    disposing solder bumps on the first portion of conductive pads and the second portion of conductive pads;
    disposing at least one semiconductor die on the top surface of the substrate and connecting the at least one semiconductor die to the top conductive traces.

2. The method of claim 1, further comprising the step of disposing an epoxy glob on the top surface of the substrate, wherein the at least one semiconductor die and a portion of the top conductive traces are encapsulated.

3. The method of claim 1, wherein the step of connecting the at least one semiconductor die to the top conductive traces is provided by bond wires.

4. The method of claim 1, wherein the step of connecting the at least one semiconductor die to the top conductive traces is provided by solder bumps.

5. A method for assembling a semiconductor device, comprising the steps of:
    providing a semiconductor die having a length, a width and a thickness;
    providing a multi-layer printed wiring board (PWB) substrate having a top surface, a bottom surface, side edges, and at least two insulating layers;
    the at least two insulating layers including a top layer greater in depth than the thickness of the semiconductor die, and a bottom layer, the top surface being formed by the top layer and the bottom surface being formed by the bottom layer, said top layer having a peripheral area, and a hole through the top layer defining a cavity area extending into the substrate from the top surface of the substrate, said hole being located in a central area within the peripheral area and said cavity having a length and width greater than the length and width, respectively, of the semiconductor die, and a bottom surface of the cavity being defined by an insulating layer;
    disposing at least one patterned conductive layer between the insulating layers, where a first patterned conductive layer is immediately below the top insulating layer and immediately above another insulating layer;
    providing top conductive traces in said first patterned conductive layer, the top conductive traces extending from the first patterned conductive layer into the cavity area defined by the hole in the top layer;
    disposing a first portion of conductive pads on the bottom surface of the substrate, the first portion of conductive pads having a first pitch;
    disposing a second portion of conductive pads on the bottom surface of the substrate, the second portion of conductive pads encircling the first portion of conductive pads, the second portion of conductive pads having a second pitch; wherein the second pitch is greater than the first pitch;
    disposing bottom conductive traces on the bottom surface of the substrate, some of the bottom conductive traces connected to the first portion of conductive pads, and the remainder of the bottom conductive traces connected to the second portion of conductive pads;
    disposing solder bumps on the first and second portions of conductive pads;
    disposing the semiconductor die within the cavity of the PWB substrate;

connecting the semiconductor die to the top conductive traces;

extending conductive vias through the substrate, wherein the conductive vias connect the top conductive traces to the bottom conductive traces; and disposing a lid on the top surface of the substrate, thereby covering the hole and sealing the cavity, wherein at least a portion of the conductive vias are disposed directly underneath the cavity and at least a portion of the conductive pads are disposed directly underneath the cavity.

6. The method of claim 5, wherein the first portion of conductive pads are arranged in a square rectangle on the bottom surface of the substrate.

7. The method of claim 5, wherein the step of connecting the semiconductor die to the top conductive traces is provided by bond wires.

8. The method of claim 5, wherein the step of connecting the at least one semiconductor die to the top conductive traces is provided by solder bumps.

9. A method for assembling a semiconductor device, comprising the steps of:

providing a first printed circuit board (PCB) substrate having an opening;

providing a second PCB substrate disposed under the first PCB substrate, the second PCB substrate having one side and an opposite side;

disposing a first patterned conductive layer on the one side of the second PCB substrate between the first PCB substrate and the second PCB substrate, the first patterned conductive layer extending to within the opening;

disposing a first portion of conductive pads on the opposite side of the PCB substrate, the first portion of conductive pads having a first pitch;

disposing a second portion of conductive pads on the opposite side of the PCB substrate, the second portion of conductive pads encircling the first portion of conductive pads, the second portion of conductive pads having a second pitch; wherein the second pitch is greater than the first pitch;

disposing a second patterned conductive layer on the opposite side of the second PCB substrate, and extending the second patterned conductive layer to the first and second portions of conductive pads on the opposite side of the second PCB substrate;

disposing conductive ball bump elements on the pads;

disposing a semiconductor die entirely within the opening, supported by the one side of the second PCB substrate, and connected to the first patterned conductive layer; and extending conductive vias through the second PCB substrate, and connecting the first patterned layer to the second patterned layer therewith;

wherein:

at least a portion of the conductive vias are disposed through the second substrate below the die-receiving opening in the first substrate; and at least a portion of the conductive ball bump elements are disposed on the opposite side of the second substrate below the die-receiving opening in the first substrate.

10. The method of claim 9, further comprising the step of disposing a lid disposed over the opening and thereby sealing the die in the opening.

11. The method of claim 9, wherein the second substrate comprises two or more PCB substrates.

12. The method of claim 9, wherein the opening is located at a central position of the first substrate.

* * * * *